(12) United States Patent
Kim et al.

(10) Patent No.: US 8,878,253 B2
(45) Date of Patent: Nov. 4, 2014

(54) SEMICONDUCTOR DEVICES

(75) Inventors: Hong-Soo Kim, Yongin-si (KR);
Hwa-Kyung Shin, Yongin-si (KR);
Moo-Kyung Lee, Gunpo-si (KR);
Jong-Ho Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 276 days.

(21) Appl. No.: 13/099,482

(22) Filed: May 3, 2011

(65) Prior Publication Data
US 2011/0303965 A1  Dec. 15, 2011

(30) Foreign Application Priority Data

Jun. 14, 2010 (KR) ................... 10-2010-0055847

(51) Int. Cl.
*H01L 27/118* (2006.01)
*H01L 27/115* (2006.01)
*H01L 21/28* (2006.01)
*H01L 29/788* (2006.01)
*H01L 29/423* (2006.01)

(52) U.S. Cl.
CPC .... *H01L 29/42324* (2013.01); *H01L 27/11546* (2013.01); *H01L 27/11526* (2013.01); *H01L 21/28273* (2013.01); *H01L 29/7881* (2013.01)
USPC ........... 257/202; 257/207; 257/208; 438/128; 438/587

(58) Field of Classification Search
USPC ......... 257/200, 202, 296, 314–316, 347, 272; 438/275, 401, 424
See application file for complete search history.

(56) References Cited

U.S. PATENT DOCUMENTS

| | | | |
|---|---|---|---|
| 6,455,894 B1 * | 9/2002 | Matsumoto et al. | 257/347 |
| 6,621,117 B2 | 9/2003 | Araki et al. | |
| 2003/0111671 A1 | 6/2003 | Araki et al. | |
| 2003/0183860 A1 * | 10/2003 | Uchiyama et al. | 257/296 |
| 2007/0221957 A1 * | 9/2007 | Kitajima et al. | 257/202 |
| 2008/0230812 A1 * | 9/2008 | Disney et al. | 257/272 |
| 2008/0258201 A1 * | 10/2008 | Baba et al. | 257/316 |

FOREIGN PATENT DOCUMENTS

| | | |
|---|---|---|
| JP | 2003188286 | 7/2003 |
| JP | 2008140977 | 6/2008 |
| KR | 1020060022573 | 3/2006 |
| KR | 1020070092028 | 9/2007 |

* cited by examiner

*Primary Examiner* — Errol Fernandes
(74) *Attorney, Agent, or Firm* — Onello & Mello, LLP

(57) ABSTRACT

A semiconductor device and method of manufacturing a semiconductor device include a plurality of first active regions and a second active region being formed on a substrate. The second active region is formed between two of the first active regions. A plurality of gate structures is formed on respective first active regions. A dummy gate structure is formed on the second active region, and a first voltage is applied to the dummy gate structure.

16 Claims, 16 Drawing Sheets

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

SEMICONDUCTOR DEVICES

CROSS REFERENCE TO RELATED APPLICATIONS

This application claims priority under 35 USC §119 to Korean Patent Application No. 10-2010-0055847 filed on Jun. 14, 2010 in the Korean Intellectual Property Office (KIPO), the contents of which are herein incorporated by reference in their entirety.

BACKGROUND

1. Field

Exemplary embodiments relate to semiconductor devices and methods of manufacturing the semiconductor devices. More particularly, exemplary embodiments relate to semiconductor devices having a dummy gate structure and methods of manufacturing the dummy gate structure and the semiconductor devices.

2. Description of the Related Art

Oftentimes, high voltages are applied to substrates of semiconductor devices. In order to enhance the ability of the devices to withstand the high voltages without damage, gate structures formed on a region of a substrate to which a high voltage is applied may be formed to have a low density. As a result of the low density of the gate structures, an insulation layer covering the gate structures may have a height difference according to position on the device. In order to reduce the height difference, dummy gate structures may be formed between the actual gate structures that cause the height difference.

However, the dummy gate structure is usually formed on an isolation layer on the substrate. In order to lower the effective field oxide height (EFH) to reduce cell interference, the isolation layer may be formed to have a height lower than the top surface of the substrate. As a result, the dummy gate structure may have a height different from that of the gate structures, so that the height difference of the insulation layer covering the gate structures and the dummy gate structure may not be effectively reduced.

SUMMARY

Exemplary embodiments provide a semiconductor device including a dummy gate structure having improved characteristics.

Exemplary embodiments provide a method of manufacturing a semiconductor device including the dummy gate structure having improved characteristics.

According to one aspect, the inventive concept is directed to a semiconductor device. The semiconductor device includes a substrate having a plurality of first active regions and a second active region disposed between two of the first active regions. A plurality of gate structures is disposed respectively on the plurality of first active regions. A dummy gate structure is disposed on the second active region, and a first voltage is applied to the dummy gate structure.

In some exemplary embodiments, an impurity region may be disposed on a portion of the second active region to prevent a channel from being generated in the second active region.

In some exemplary embodiments, the first and second active regions may be defined by an isolation layer on the substrate, and the impurity region may be formed adjacent to a lower portion of the isolation layer.

In some exemplary embodiments, each of the gate structures may include a first tunnel insulation layer pattern, a first floating gate, a first dielectric layer pattern and a first control gate sequentially stacked on each of the first active regions, and the dummy gate structure may include a second tunnel insulation layer pattern, a second floating gate, a second dielectric layer pattern and a second control gate sequentially stacked on the second active region.

In some exemplary embodiments, the second control gate may have a width larger than widths of the second floating gate and the second tunnel insulation layer pattern.

In some exemplary embodiments, the second floating gate and the second tunnel insulation layer pattern may have a width substantially the same as a width of the second active region.

In some exemplary embodiments, the dummy gate structure may include a material that is substantially the same as a material of the gate structures, and the dummy gate structure has a height substantially the same as a height of the gate structures.

In some exemplary embodiments, the semiconductor device may further include a wiring or conductive element for applying a first voltage to the dummy gate structure, and a second voltage higher than the first voltage may be applied to the gate structures.

In some exemplary embodiments, each of the gate structures may include a first tunnel insulation layer pattern, a first charge trapping layer pattern, a first blocking layer pattern and a first gate electrode sequentially stacked on each of the first active regions, and the dummy gate structure may include a second tunnel insulation layer pattern, a second charge trapping layer pattern, a second blocking layer pattern and a second gate electrode sequentially stacked on the second active region.

In some exemplary embodiments, the second gate electrode may have a width larger than widths of the second charge trapping layer pattern and the second tunnel insulation layer pattern.

According to another aspect, the inventive concept is directed to a semiconductor device. The semiconductor device includes a substrate having a peripheral region and a cell region, the peripheral region including a plurality of first active regions and a second active region disposed between two of the first active regions, the cell region including a third active region. The device includes a plurality of first gate structures disposed respectively on the plurality of first active regions of the substrate. The device further includes a dummy gate structure disposed on the second active region, a first voltage being applied to the dummy gate structure. The device further includes a plurality of second gate structures disposed on the third active region.

In some exemplary embodiments, an impurity region is disposed on a portion of the second active region to prevent a channel from being generated in the second active region.

In some exemplary embodiments, each of the first gate structures may include a first tunnel insulation layer pattern, a first floating gate, a first dielectric layer pattern and a first control gate sequentially stacked on each of the first active regions. The dummy gate structure may include a second tunnel insulation layer pattern, a second floating gate, a second dielectric layer pattern and a second control gate sequentially stacked on the second active region. Each of the second gate structures may include a third tunnel insulation layer pattern, a third floating gate, a third dielectric layer pattern and a third control gate sequentially stacked on each of the third active regions.

In some exemplary embodiments, the second control gate may have a width larger than widths of the second floating gate and the second tunnel insulation layer pattern.

In some exemplary embodiments, the dummy gate structure may include a material substantially the same as a material of the first and second gate structures and a height substantially the same as a height of the first and second gate structures.

In exemplary embodiments, the semiconductor device may further include a wiring or conductive element for applying a first voltage to the dummy gate structure, and a second voltage higher than the first voltage may be applied to the first gate structures.

According to another aspect, the inventive concept is directed to a method of manufacturing a semiconductor device. In the method, an isolation layer is formed on a substrate to form a plurality of first active regions and a second active region between the first active regions. A plurality of gate structures is formed on the active regions and a dummy gate structure on the second active region. A wiring electrically connected to the dummy gate structure is formed.

In some exemplary embodiments, an impurity region may be further formed on a portion of the second active region to prevent a channel from being generated in the second active region.

In some exemplary embodiments, each of the gate structures may include a first tunnel insulation layer pattern, a first floating gate, a first dielectric layer pattern and a first control gate sequentially stacked on each of the first active regions. The dummy gate structure may include a second tunnel insulation layer pattern, a second floating gate, a second dielectric layer pattern and a second control gate sequentially stacked on the second active region.

In some exemplary embodiments, the second control gate may have a width larger than those of the second floating gate and the second tunnel insulation layer pattern.

According to another aspect, the inventive concept is directed to a method of manufacturing a semiconductor device, comprising: providing a substrate; forming a plurality of first active regions on the substrate; forming a second active region on the substrate, the second active region being disposed between two of the first active regions; forming a plurality of gate structures on the plurality of first active regions, respectively; forming a dummy gate structure on the second active region; and forming a conductive element connected to the dummy gate structure such that a first voltage can be applied to the dummy gate structure.

In some exemplary embodiments, the method further comprises forming an impurity region in a portion of the second active region to prevent a channel from being formed in the second active region.

In some embodiments, a second voltage higher than the first voltage is applied to the gate structures.

In some exemplary embodiments, the method further comprises forming an isolation layer on the substrate, the isolation layer defining the first and second active regions.

According to some exemplary embodiments of the present inventive concept, a dummy gate structure may be formed between gate structures in a high voltage region to increase the total density of gate structures. The dummy gate structure may be formed on an active region to have a height substantially the same as the height of the gate structures, thereby serving as an etch stop layer for an insulating interlayer subsequent formed. Additionally, a voltage may be applied to the dummy gate structure to prevent the breakdown voltage of an impurity region adjacent to the gate structures from decreasing.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
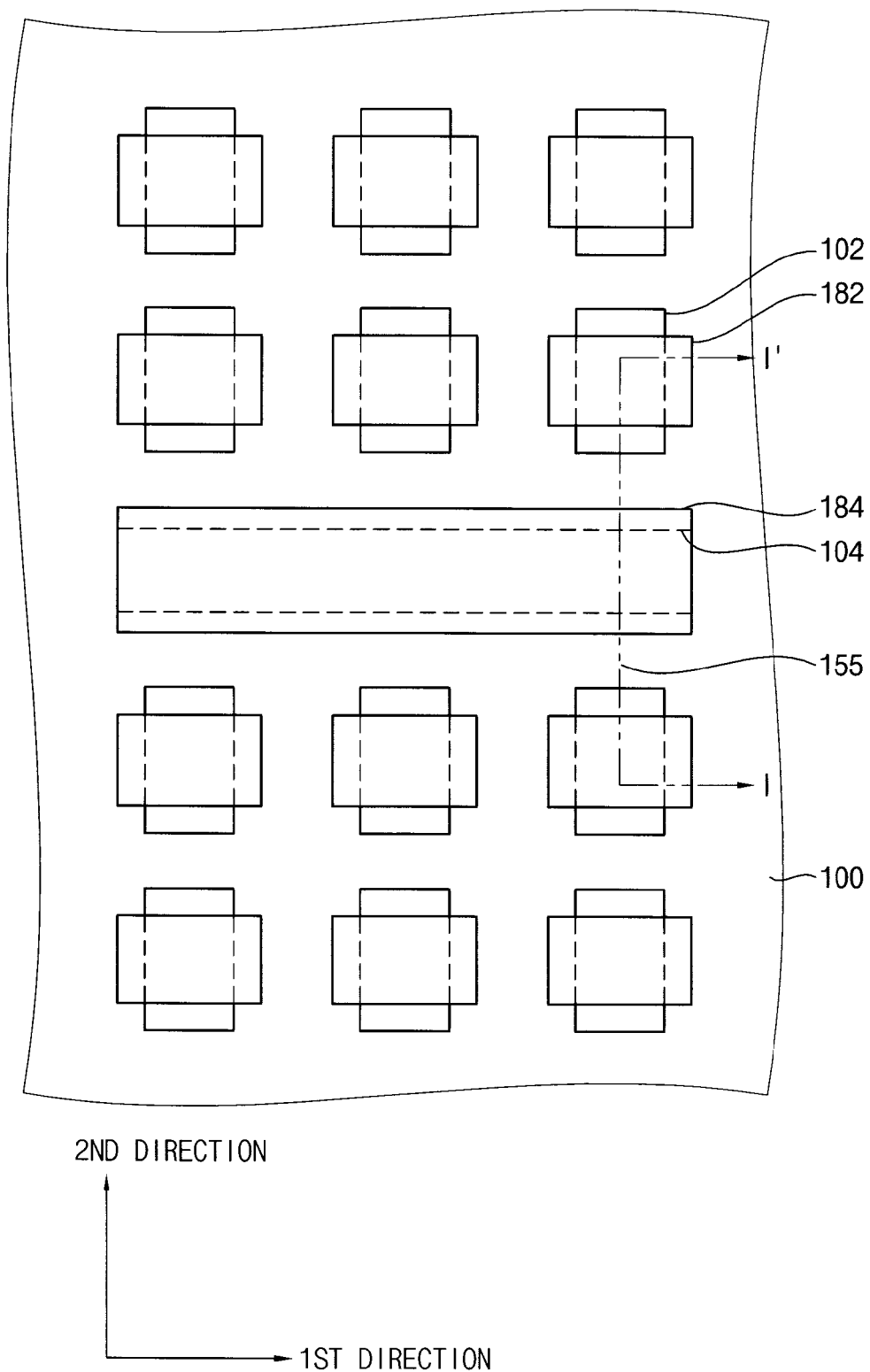
FIG. 1 is a schematic plan view illustrating a semiconductor device in accordance with exemplary embodiments of the inventive concept.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be described in detail with reference to the accompanying drawings.

Figure 2:
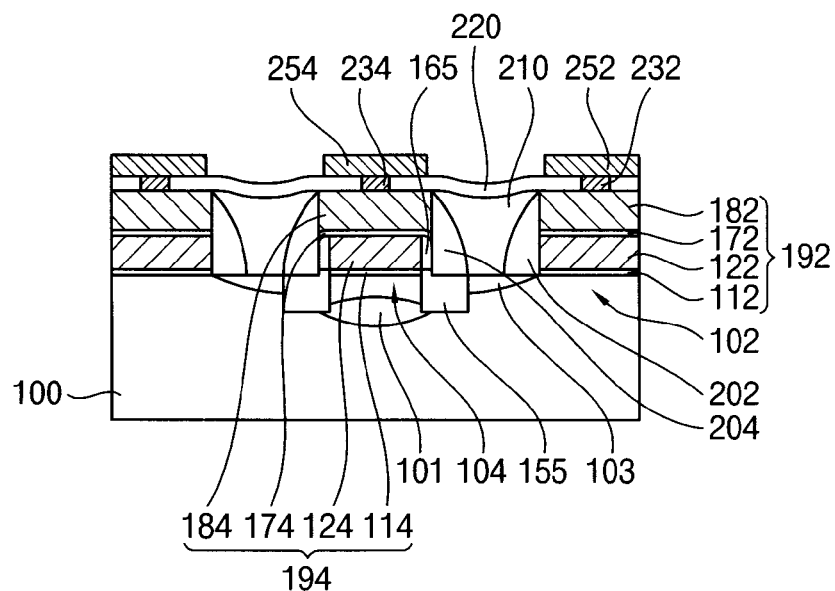
FIG. 2 is a schematic cross-sectional view of the semiconductor device in FIG. 1 cut along the line I-I'.

FIG. 1 is a schematic plan view illustrating a semiconductor device in accordance with exemplary embodiments of the inventive concept, and FIG. 2 is a schematic cross-sectional view of the semiconductor device in FIG. 1 cut along the line I-I'. For the convenience of illustration and understanding of the inventive concept, only gate structures and active regions are shown in FIG. 1.

Referring to FIGS. 1 and 2, the semiconductor device may include a gate structure 192 and a dummy gate structure 194 on first and second active regions 102 and 104, respectively, of a substrate 100.

The substrate 100 may be one of several types of substrate, such as a silicon substrate, a germanium substrate or a silicon-germanium substrate, a silicon-on-insulator (SOI) substrate, a germanium-on-insulator (GOI) substrate, and the like. The substrate 100 may have a well region (not shown) doped with n-type or p-type impurities.

The first and second active regions 102 and 104 may be defined by an isolation layer pattern 155. A region of the substrate 100 on which the isolation layer pattern 155 is formed may be referred to as a field region. Other regions of the substrate 100 may be referred to as the first active region 102 or the second active region 104.

The isolation layer pattern 155 may be formed of or include an oxide. For example, the isolation layer pattern 155 may include boro silicate glass (BSG), boro phosphor silicate glass (BPSG), undoped silicate glass (USG), spin on glass (SOG), flowable oxide (FOX), tetra ethyl ortho silicate (TEOS), high density plasma (HDP) oxide, high temperature oxide (HTO), and/or other such material.

In some exemplary embodiments, a plurality of first active regions 102 may be formed. In some particular exemplary embodiments, the first active regions 102 may have an island shape. The second active region 104 may be formed between adjacent first active regions 102 and may extend in a first direction parallel to a top surface of the substrate 100. In some exemplary embodiments, a plurality of second active regions 104 may be formed in a second direction which is substantially perpendicular to the first direction.

A first impurity region 101 may be formed at a portion of the second active region 104 of the dummy gate structure 194 to prevent a channel from being generated under the dummy gate structure 194. For example, when the semiconductor device is formed in a negative-channel metal oxide semiconductor (NMOS) region, the substrate 100 may be lightly doped with p-type impurities, and the first impurity region 101 may be heavily doped with p-type impurities. As a result, no channel may be formed in the second active region 104, and, therefore, weakening of the isolation between the first active regions 102 is avoided. In exemplary embodiments, the first impurity region 101 may be formed adjacent to a lower portion of the isolation layer pattern 155.

Each of the gate structures 192 may include a first tunnel insulation layer pattern 112, a first floating gate 122, a first dielectric layer pattern 172 and a first control gate 182 sequentially formed on the substrate 100 in each of the first active regions 102.

In some exemplary embodiments, the first tunnel insulation layer pattern 112 may include or be formed of at least one of an oxide such as silicon oxide, an oxynitride such as silicon oxynitride, and a low-k material.

In some exemplary embodiments, the first floating gate 122 may include or be formed of at least one of doped polysilicon or a metal having a high work function such as, for example, tungsten, titanium, cobalt, nickel, and/or other such material.

In some exemplary embodiments, the first dielectric layer pattern 172 may include or be formed of, for example, an oxide and/or a nitride. In some exemplary embodiments, the first dielectric layer pattern 172 may have a multi-layered structure, e.g., an ONO structure including an oxide layer/nitride layer/oxide layer stacked structure. Alternatively, the first dielectric layer pattern 172 may include a metal oxide having a high dielectric constant, thereby increasing capacitance and reducing leakage current. For example, in some exemplary embodiments, the metal oxide may include hafnium oxide, titanium oxide, tantalum oxide, zirconium oxide, aluminum oxide, and/or other similar material.

In some exemplary embodiments, the first control gate 182 may include or be formed of at least one of doped polysilicon, a metal, a metal nitride, a metal silicide, and/or other similar material. In an exemplary embodiment, the first control gate 182 may include or be formed of a doped polysilicon layer, an ohmic layer, a diffusion barrier layer, an amorphous layer and/or a metal layer sequentially stacked on the first dielectric layer pattern 172. For example, in some exemplary embodiments, the ohmic layer may include at least one of titanium, tantalum, tungsten, molybdenum or an alloy thereof. The diffusion barrier layer may include at least one of tungsten nitride, titanium nitride, tantalum nitride, molybdenum nitride, and/or other similar material. In some exemplary embodiments, for example, the amorphous layer may include a refractory metal silicide such as amorphous tungsten silicide, amorphous titanium silicide, amorphous molybdenum silicide and/or amorphous tantalum silicide, and the metal layer may include tungsten, titanium, tantalum, molybdenum and/or an alloy thereof.

In exemplary embodiments, the gate structures 192 may have a width in the second direction smaller than that of the first active regions 102. Therefore, second impurity regions 103 may be formed at upper portions of the first active regions 102 adjacent to the gate structures 192. When the semiconductor device is formed in the NMOS region, the second impurity regions 103 may be doped with n-type impurities. In an exemplary embodiment, the second impurity regions 103 may have a lightly doped drain (LDD) structure.

In some exemplary embodiments, each gate structure 192 and the second impurity regions 103 may form a transistor. In this configuration, the second impurity regions 103 may serve as source/drain regions of the transistor. In exemplary embodiments, the transistor may be a high-voltage transistor to which a high voltage may be applied. In exemplary embodiments, the gate structures 192 may be electrically connected to a first wiring 252 via a first plug 232, and a high voltage may be applied to the gate structures 192 by the first wiring 252. In an exemplary embodiment, the first plug 232 may contact a top surface of the first control gate 182. Alternatively, the first plug 232 may contact a top surface of the second impurity regions 103.

In some exemplary embodiments, a second spacer 202 may be formed on sidewalls of the gate structures 192. The second spacer 202 may include or be formed of, for example, an oxide or a nitride. In an exemplary embodiment, the second spacer 202 may include a material substantially the same as that of the isolation layer pattern 155.

In some exemplary embodiments, the dummy gate structure 194 may include or be formed of a second tunnel insulation layer pattern 114, a second floating gate 124, a second dielectric layer pattern 174 and a second control gate 184 sequentially formed on the second active region 104. When a plurality of second active regions 104 is formed, a plurality of dummy gate structures 194 may be formed.

In some exemplary embodiments, the second tunnel insulation pattern 114, the second floating gate 124, the second dielectric layer pattern 174 and the second control gate 184 may include materials and thicknesses substantially the same as those of the first tunnel insulation pattern 112, the first floating gate 122, the first dielectric layer pattern 172 and the first control gate 182, respectively, as described above in detail. As a result, the dummy gate structure 194 may have a height substantially the same as that of the gate structures 192.

In some exemplary embodiments, the second tunnel insulation layer pattern 114 and the second floating gate 124 may have a width in the second direction substantially the same as that of the second active region 104. Additionally, the second control gate 184 may have a width in the second direction larger than that of the second tunnel insulation layer pattern 114 and the second floating gate 124. In an exemplary embodiment, the second dielectric layer pattern 174 may have a width in the second direction substantially the same as that of the second control gate 184. In another exemplary embodiment, the second dielectric layer pattern 174 may have a width in the second direction substantially the same as that of the second tunnel insulation layer pattern 114 and the second floating gate 124.

In some exemplary embodiments, a first spacer 165 may be formed on a sidewall of the second floating gate 124, and a third spacer 204 may be formed on sidewalls of the second control gate 184, the second dielectric layer pattern 174 and the first spacer 165. In some exemplary embodiments, the first and third spacers 165 and 204 may include or be formed of, for example, an oxide and/or a nitride. In an exemplary embodiment, the first and third spacers 165 and 204 may include a material substantially the same as that of the second spacer 202.

In the exemplary embodiment illustrated in FIG. 1, the isolation layer pattern 155 is not shown to have a constant height. However, in an exemplary embodiment, the isolation layer pattern 155 may have a height substantially the same as that of the second tunnel insulation layer pattern 114.

As described in detail above, the dummy gate structure 194 may have a structure similar to that of the gate structures 192. However, even if a voltage is applied to the dummy gate structure 194, no channel may be formed in the second active region 104 under the dummy gate structure 194. That is, the dummy gate structure 194 may not move carriers in the second active region 104 in response to the applied voltage. The dummy gate structure 194 having the same height as that of the gate structures 192 may only increase the density of the total gate structures 192 and 194.

In exemplary embodiments, a voltage may be applied to the dummy gate structure 194, and a breakdown voltage (BV) of the second impurity region 103 may be prevented from decreasing due to the gate induced drain leakage (GIDL). The voltage applied to the dummy gate structure 194 may be lower than that of the gate structures 192. In exemplary embodiments, the dummy gate structure 194 may be electrically connected to a second wiring 254 via a second plug 234, and the voltage may be applied to the dummy gate structure 194 by the second wiring 254 via the second plug 234. In exemplary embodiments, the second plug 234 may contact a top surface of the second control gate 184.

In some exemplary embodiments, an insulating interlayer pattern 210 covering the second and third spacers 202 and 204 may be formed on the substrate 100. In some exemplary alternative embodiments, the insulating interlayer pattern 210 may cover not only the second and third spacers 202 and 204 but also may cover the gate structures 192 and the dummy gate structure 194. In some exemplary embodiments, the insulating interlayer pattern 210 may include an oxide.

In some exemplary embodiments, a capping layer 220 may be formed on the gate structures 192, the dummy gate structure 194 and the insulating interlayer pattern 210. In some exemplary embodiments, the capping layer 220 may include or be formed of, for example, a nitride. In an exemplary embodiment, the first and second plugs 232 and 234 may be formed through the capping layer 220.

In the foregoing detailed description, the gate structures 192 and the dummy gate structure 194 have been described in detail in the context of floating gate type flash memory devices. However, the inventive concept may be also applied to charge trapping type flash memory devices. That is, each of the gate structures 192 may include a first tunnel insulation layer pattern 112, a first charge trapping layer pattern 122, a first blocking layer pattern 172 and a first gate electrode 182 sequentially stacked on each first active region 102, and the dummy gate structure 194 may include a second tunnel insulation layer pattern 114, a second charge trapping layer pattern 124, a second blocking layer pattern 174 and a second gate electrode 184 sequentially stacked on each second active region 104.

In some exemplary embodiments, the first and second charge trapping layer patterns 122 and 124 may include or be formed of, for example, a nitride such as silicon nitride or a hafnium oxide such as hafnium silicon oxide. In some exemplary embodiments, the first and second blocking layer patterns 172 and 174 may include or be formed of, for example, silicon oxide or a metal oxide having a high dielectric constant, e.g., hafnium oxide, titanium oxide, tantalum oxide, zirconium oxide or aluminum oxide. Additionally, in some exemplary embodiments, the first and second gate electrodes 182 and 184 may include, for example, at least one of doped polysilicon, a metal, a metal nitride, a metal silicide, and/or other such material.

FIGS. 3 to 11 are schematic cross-sectional views illustrating a method of manufacturing a semiconductor device in accordance with exemplary embodiments of the inventive concept.

Figure 3:
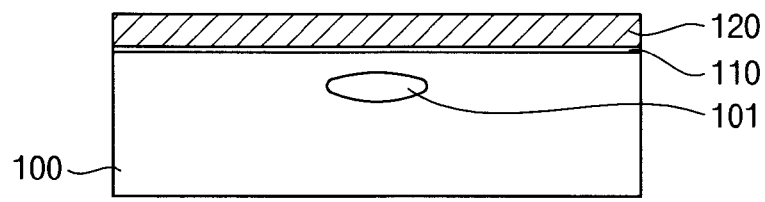
FIGS. 3 to 11 are schematic cross-sectional views illustrating a method of manufacturing a semiconductor device in accordance with exemplary embodiments of the inventive concept.

Referring to FIG. 3, first impurities may be implanted into a substrate 100 to form a first impurity region 101. In exemplary embodiments, the first impurity region 101 may be formed by heavily doping, for example, p-type impurities into the substrate 100. In an exemplary embodiment, the first impurity region 101 may be formed at an upper portion of the substrate 100 that does not contact a top surface of the substrate 100. Before forming the first impurity region 101, p-type or n-type impurities may be implanted into the substrate 100 to form a well region (not shown).

In some exemplary embodiments, a tunnel insulation layer 110 and a floating gate layer 120 may be sequentially formed on the substrate 100.

In some exemplary embodiments, the tunnel insulation layer 110 may be formed by, for example, oxidizing the top surface of the substrate 100. In other alternative exemplary embodiments, the tunnel insulation layer 110 may be formed using, for example, an oxide, an oxynitride or a low-k material by, for example, a chemical vapor deposition (CVD) process, an atomic layer deposition (ALD) process or a physical vapor deposition (PVD) process.

In some exemplary embodiments, the floating gate layer 120 may be formed using, for example, doped polysilicon or a metal having a high work function, e.g., tungsten, titanium, cobalt, nickel, or other such material.

Figure 4:
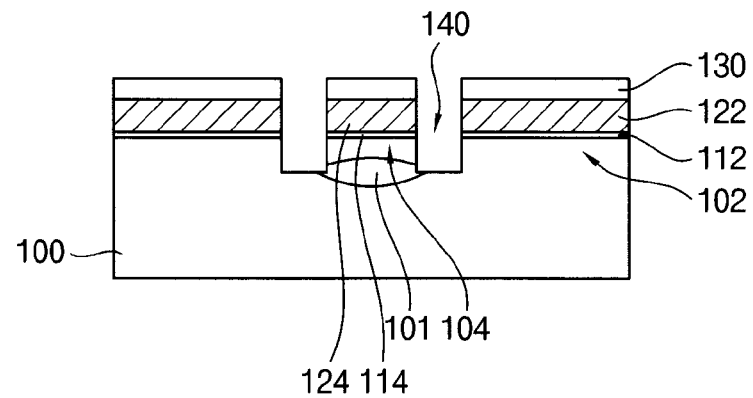

Referring to FIG. 4, a hard mask 130 may be formed on the floating gate layer 120. In some exemplary embodiments, the hard mask 130 may be formed using, for example, a nitride.

The floating gate layer 120, the tunnel insulation layer 110 and an upper portion of the substrate 100 may be etched using the hard mask 130 as an etching mask to form a trench 140. As a result of the formation of the trench 140, first and second active regions 102 and 104 divided by the trench 140 may be formed in the substrate 100. In some exemplary embodiments, as illustrated in FIG. 4, the trench 140 may be formed adjacent to the first impurity region 101, and an edge portion of the first impurity region 101 may be etched. Accordingly, the second active region 104 may include the first impurity region 101. In some exemplary embodiments, a plurality of first active regions 102 having an island shape may be formed. The second active region 104 may be formed between the first active regions 102, and each second active region 104 may extend in a first direction.

In some exemplary embodiments, the floating gate layer 120 and the tunnel insulation layer 110 may be partially etched to form a first tunnel insulation layer pattern 112 and a first floating gate 122 sequentially stacked on each first active region 102 and a second tunnel insulation layer pattern 114 and a second floating gate 124 sequentially stacked on the second active region 104. The first tunnel insulation layer pattern 112 and the first floating gate 122 may have an island shape on each first active region 102. The second tunnel insulation layer pattern 114 and the second floating gate 124 may extend in the first direction on the second active region 104.

Figure 5:
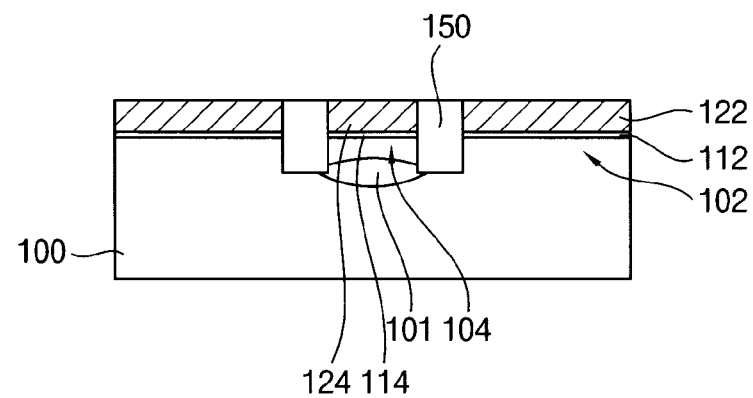

Referring to FIG. 5, in some exemplary embodiments, an isolation layer 150 may be formed to fill the trench 140. To form the isolation layer 150, in some exemplary embodiments, a first insulation layer may be formed on the substrate 100 and the hard mask 130 to sufficiently fill the trench 140. The first insulation layer may then be planarized until the first and second floating gates 122 and 124 are exposed, and the hard mask 130 may be removed to form the isolation layer 150. In some exemplary embodiments, the first insulation layer may be formed, for example, using BSG, BPSG, USG, SOG, FOX, TEOS, HDP oxide, HTO, etc., by, for example, a CVD process, an ALD process or a PVD process.

Figure 6:
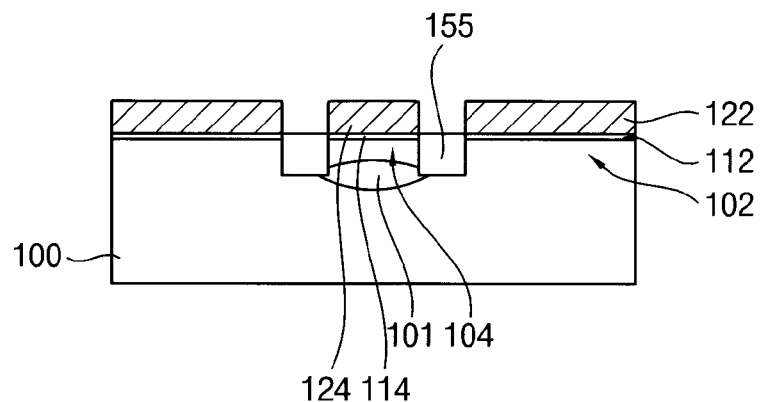

Referring to FIG. 6, in some exemplary embodiments, upper portions of the isolation layer 150 may be removed to form an isolation layer pattern 155, which exposes sidewalls of the first and second floating gates 122 and 124. In some exemplary embodiments, the isolation layer pattern 155 may be formed to have a height substantially the same as the height of top surfaces of the first and second tunnel insulation layer patterns 112 and 114. Alternatively, in some exemplary embodiments, the isolation layer pattern 155 may be formed to have a height higher than the height of top surfaces of the first and second tunnel insulation layer patterns 112 and 114.

Figure 7:
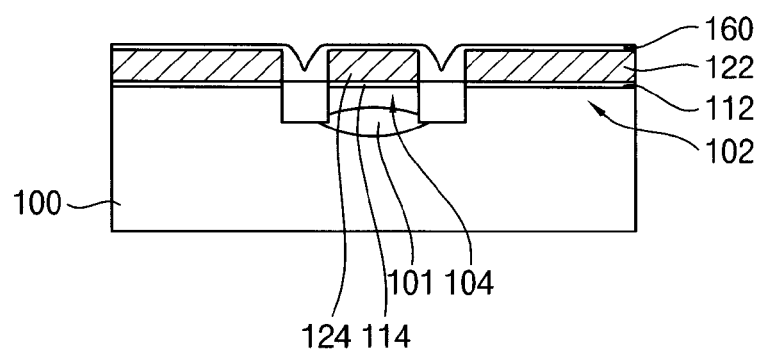

Referring to FIG. 7, in some exemplary embodiments, a first spacer layer 160 covering the first and second floating gates 122 and 124 may be formed on the substrate 100 and the isolation layer pattern 155. In some exemplary embodiments, the first spacer layer 160 may be formed using, for example, an oxide or a nitride. In some exemplary embodiments, the first spacer layer 160 may be formed using a material substantially the same as that of the first insulation layer.

Figure 8:
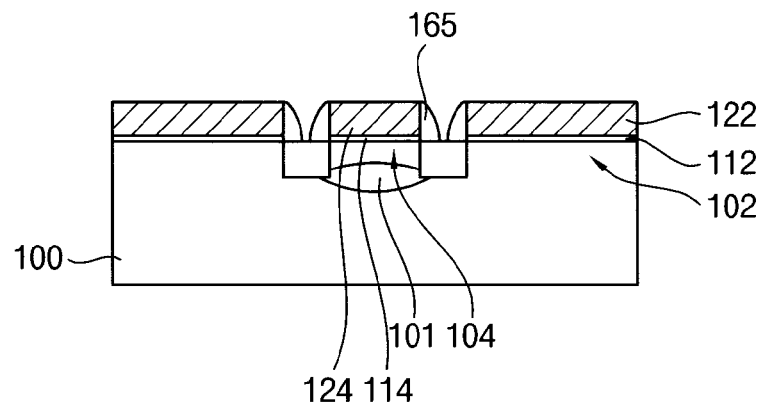

Referring to FIG. 8, in some exemplary embodiments, the first spacer layer 160 may be etched by an anisotropic etching process to form first spacers 165 on sidewalls of the first and second floating gates 122 and 124.

Figure 9:
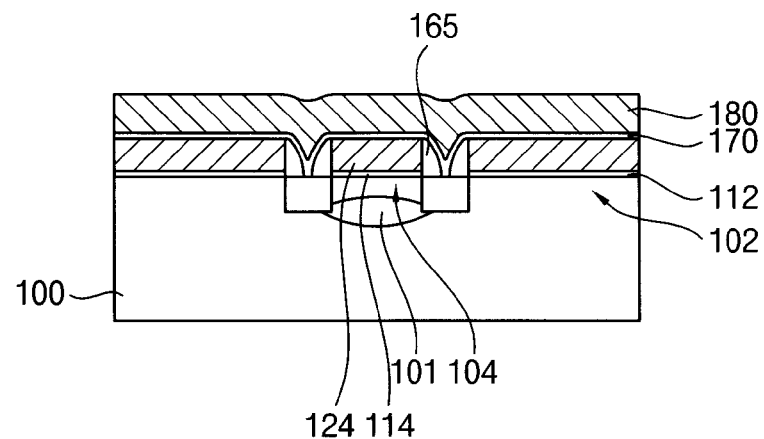

Referring to FIG. 9, in some exemplary embodiments, a dielectric layer 170 and a control gate layer 180 may be sequentially formed on the first and second floating gates 122 and 124, the first spacers 165 and the isolation layer pattern 155.

In some exemplary embodiments, the dielectric layer 170 may be formed using, for example, an oxide and/or a nitride. In some exemplary embodiments, the dielectric layer 170 may be formed to have an ONO structure including a stacked oxide layer/nitride layer/oxide layer. Alternatively, the dielectric layer 170 may be formed using a metal having a high dielectric constant.

In some exemplary embodiments, the control gate layer 180 may be formed using, for example, doped polysilicon, a metal, a metal nitride, a metal silicide, and/or other similar material. In some exemplary embodiments, the control gate layer 180 may be formed to have a multi-layered structure including a doped polysilicon layer, an ohmic layer, a diffusion barrier layer, an amorphous layer and a metal layer sequentially stacked on the dielectric layer 170.

Figure 10:
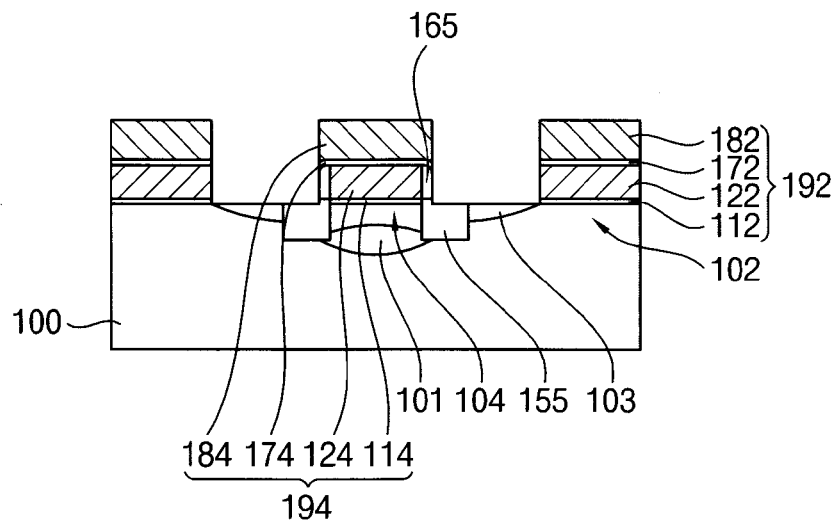

Referring to FIG. 10, in some exemplary embodiments, the control gate layer 180, the dielectric layer 170, the first floating gate 122, the first tunnel insulation layer pattern 112 and the first spacers 165 may be partially removed. As a result, gate structures 192 may be formed on the first active regions 102, and a dummy gate structure 194 may be formed on the second active region 104. In some exemplary embodiments, an upper portion of the isolation layer pattern 155 may be removed, such that it has a height substantially the same as a top surface of the first active region 102.

In some exemplary embodiments, the gate structures 192 may have an island shape on the first active regions 102 and may have a width in a second direction perpendicular to the first direction smaller than that of the first active regions 102. In some exemplary embodiments, each of the gate structures 192 may have a first tunnel insulation layer pattern 112, a first floating gate 122, a first dielectric layer pattern 172 and a first control gate 182 sequentially stacked on each first active regions 102.

In some exemplary embodiments, the dummy gate structure 194 may extend on the second active region 104 in the first direction. In some exemplary embodiments, the dummy gate structure 194 may have a second tunnel insulation layer pattern 114, a second floating gate 124, a second dielectric layer pattern 174 and a second control gate 184 sequentially stacked on the second active region 104. In some exemplary embodiments, the second control gate 184 and the second dielectric layer pattern 174 may have a width in the second direction larger than those widths of the second floating gate 124 and the second tunnel insulation layer pattern 114. As a result, a portion of the first spacers 165 may remain under the second dielectric layer pattern 174.

In some exemplary embodiments, second impurity regions 103 may be formed at upper portions of the first active regions 102 that are not covered by the gate structures 192. In some exemplary embodiments, an ion implantation process may be performed on the substrate 100 using the gate structures 192 as an ion implantation mask to form the second impurity regions 103 doped with n-type impurities.

Figure 11:
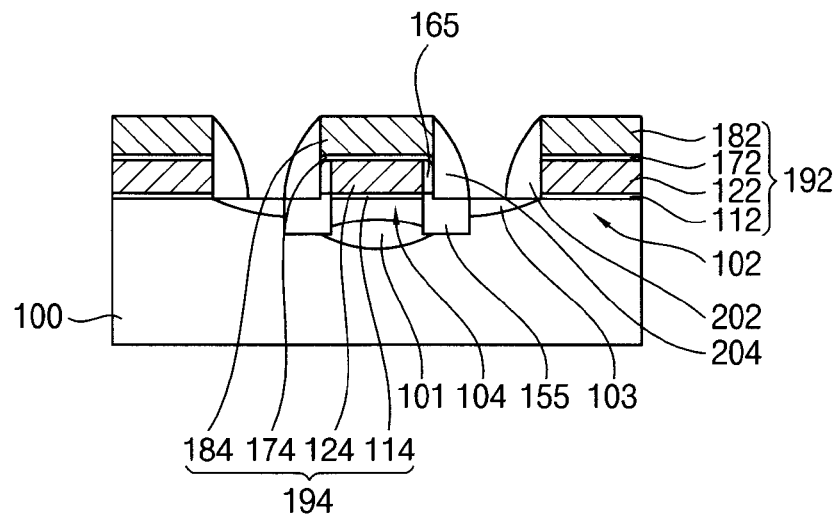

Referring to FIG. 11, in some exemplary embodiments, second spacers 202 may be formed on sidewalls of the gate structures 192, and third spacers 204 may be formed on sidewalls of the dummy gate structure 194 and the remaining portions of the first spacers 165. Specifically, a second spacer layer covering the gate structures 192, the dummy gate structure 194 and the remaining portion of the first spacers 165 may be formed on the substrate 100 and the isolation layer pattern 155, and the second spacer layer may be partially removed by an anisotropic etching process to form the second and third spacers 202 and 204. In some exemplary embodiments, the second spacers 202 may be formed to partially expose the second impurity regions 103. In some exemplary embodiments, the third spacers 204 may be formed on the isolation layer pattern 155.

In some exemplary embodiments, the second spacer layer may be formed using, for example, an oxide or a nitride. In some exemplary embodiments, the second spacer layer may be formed using a material substantially the same as that of the first spacer layer 160.

In some exemplary embodiments, an ion implantation process using the gate structures 192 and the second spacers 202 as an ion implantation mask may be further performed on the first active regions 102, so that the second impurity region 103 may be formed to have an LDD structure.

Referring to FIG. 2 again, an insulating interlayer covering the gate structures 192, the dummy gate structure 194 and the second and third spacers 202 and 204 may be formed on the substrate 100 to sufficiently fill spaces therebetween. The insulating interlayer may be planarized until the gate structures 192 and the dummy gate structure 194 are exposed to form an insulating interlayer pattern 210 on the substrate 100. The gate structures 192 and the dummy gate structure 194 may have substantially the same height, and thus the dummy gate structure 194 together with the gate structures 192 may serve as an etch stop layer or an ending point of the planarization process.

In some exemplary embodiments, a capping layer 220 may be further formed on the gate structures 192, the dummy gate structure 194 and the insulating interlayer pattern 210. In some exemplary embodiments, the capping layer 220 may be formed using, for example, a nitride or an oxide. In some alternative exemplary embodiments, the capping layer 220 may not be formed. Instead, the planarization process may be performed so that a portion of the insulation layer pattern 210 may remain on the gate structures 192 and the dummy gate structure 194.

In some exemplary embodiments, the capping layer 220 may be partially removed to form an opening (not shown) exposing the gate structures 192 and the dummy gate structure 194. A first conductive layer filling the opening may be formed on gate structures 192, the dummy gate structure 194 and the capping layer 220. An upper portion of the first conductive layer on the capping layer 220 may be removed to form first plugs 232 contacting the gate structures 192 and second plugs 234 contacting the dummy gate structure 194.

In some exemplary embodiments, a second conductive layer may be formed on the first and second plugs 232 and 234 and the capping layer 220. The second conductive layer may be patterned to foam first and second wirings 252 and 254, respectively.

The semiconductor device of the embodiments of the inventive concept may be manufactured by the above described manufacturing processes.

Figure 12:
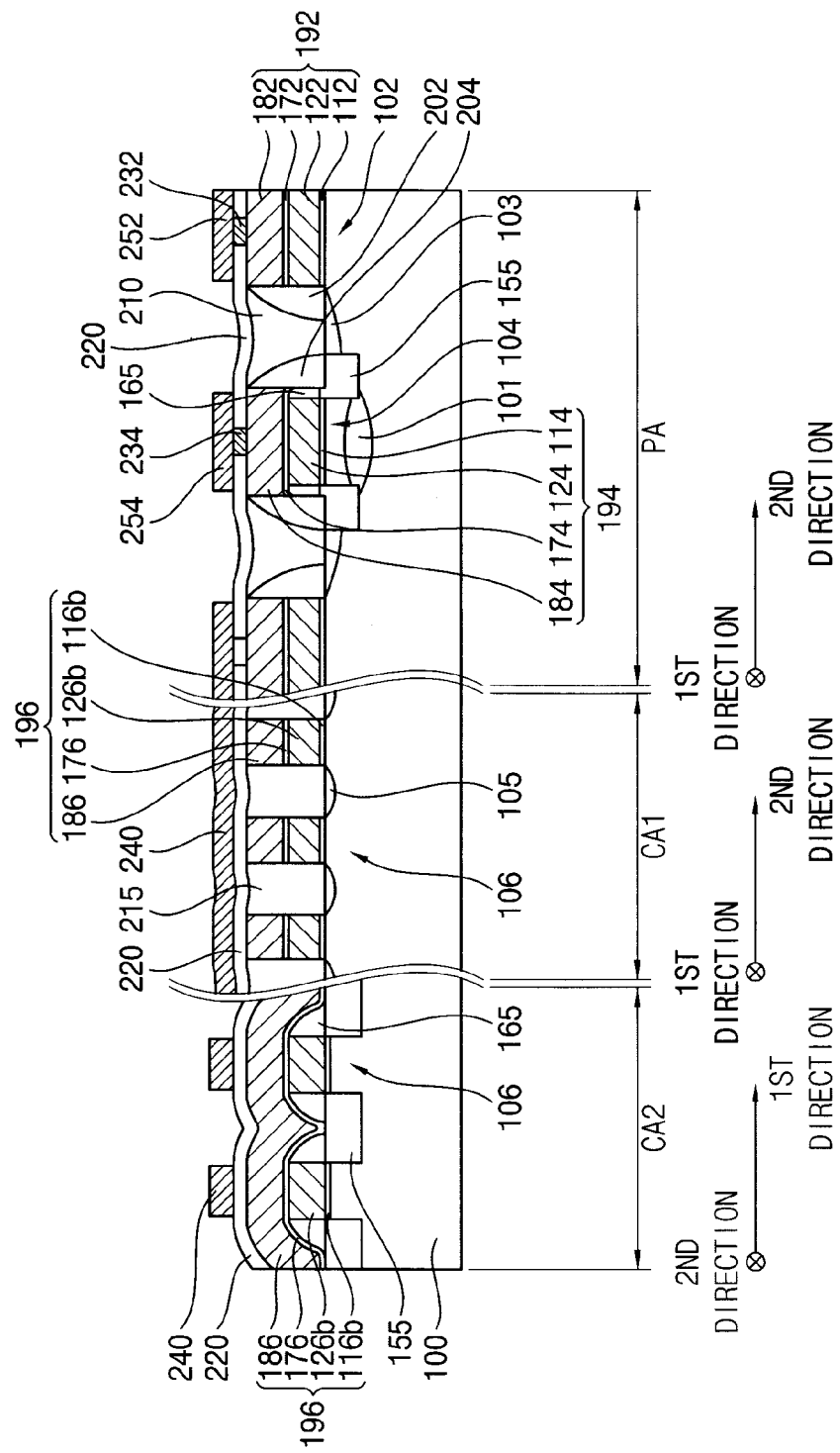
FIG. 12 is a schematic cross-sectional view illustrating a semiconductor device in accordance with exemplary embodiments of the inventive concept.

FIG. 12 is a schematic cross-sectional view illustrating a semiconductor device in accordance with some exemplary embodiments of the inventive concept. The semiconductor device in FIG. 12 includes any of the embodiments of the semiconductor device illustrated, for example, in FIGS. 1 and 2 in a peripheral region and further memory cells in a cell region. Like reference numerals refer to like elements, and detailed description of like elements will not be repeated.

Referring to FIG. 12, the semiconductor device may be formed on a substrate 100. The substrate 100 may have a peripheral region PA and first and second cell regions CA1 and CA2. Specifically, in some exemplary embodiments, the semiconductor device may include first gate structures 192 and dummy gate structure 194 on first and second active regions 102 and 104, respectively, of the peripheral region PA. In some exemplary embodiments, the first gate structures 192 and the dummy gate structure 194 may be formed on a high voltage region of the peripheral region PA. Additionally, in some exemplary embodiments, the semiconductor device may include second gate structures 196 on a third active region 106 of the cell regions CA1 and CA2. In FIG. 12, the first cell region CAL like the peripheral region PA, is illustrated by a cross-sectional view of the semiconductor device cut along a second direction. In FIG. 12, the second cell region CA2 is illustrated by a cross-sectional view of the semiconductor device cut along a first direction substantially perpendicular to the second direction.

In some exemplary embodiments, like the first and second active regions 102 and 104, the third active region 106 may be defined by an isolation layer pattern 155. That is, a portion of the cell regions CA1 and CA2 of the substrate 100 on which the isolation layer pattern 155 is formed may be referred to as a field region, and other portions of the cell regions CA1 and CA2 may be referred to as the third active region 106.

In some exemplary embodiments, a plurality of third active regions 106 may be formed in the first direction, and each third active region 106 may extend in the second direction.

In some exemplary embodiments, each of the second gate structures 196 may include a third tunnel insulation layer pattern 116b, a third floating gate 126b, a third dielectric layer pattern 176 and a third control gate 186 sequentially stacked on the third active region 106.

In some exemplary embodiments, the third tunnel insulation layer pattern 116b and the third floating gate 126b may have an island shape, and third dielectric layer pattern 176 and the third control gate 186 may extend in the first direction on the third active region 106 and the isolation layer pattern 155. In some alternative exemplary embodiments, the third tunnel insulation layer pattern 116b may extend in the second direction on the third active region 106 and the isolation layer pattern 155. In some exemplary embodiments, the third tunnel insulation layer pattern 116b and the third floating gate 126b may have a width in the first direction substantially the same as that of the third active region 106.

In some exemplary embodiments, the third tunnel insulation layer pattern 116b may include a material and have a height that are substantially the same as those of the first and second tunnel insulation layer patterns 112 and 114. In some exemplary embodiments, the third floating gate 126b may include a material and have a height substantially the same as those of first and second floating gates 122 and 124. In some exemplary embodiments, the third dielectric layer pattern 176 may include a material and have a height substantially the same as those of first and second dielectric layer patterns 172 and 174. In some exemplary embodiments, the third control gate 186 may include a material and have a height substantially the same as those of first and second control gates 182 and 184.

In some exemplary embodiments, third impurity regions 105 may be formed at upper portions of the third active region 106 adjacent to the second gate structures 196. In some exemplary embodiments, the third impurity region 105 may include n-type impurities. Each second gate structure 196 and the third impurity regions 105 may form a cell transistor. In some exemplary embodiments, the third control gates 186 of the second gate structures 196 may serve as a word line, a string selection line (SSL) or a ground selection line (GSL).

In some exemplary embodiments, the isolation layer pattern 155 may have a height substantially the same as that of the third tunnel insulation layer pattern 116b. In some alternative exemplary embodiments, the isolation layer pattern 155 may have a height higher than that of the third tunnel insulation layer pattern 116b.

In some exemplary embodiments, first spacers 165 may be formed on sidewalls of the third floating gates 126. Additionally, a second insulating interlayer pattern 215 may be formed between the second gate structures 196. A capping layer 220 may be further formed on the second gate structures 196 and the second insulating interlayer pattern 215.

In some exemplary embodiments, a bit line 240 may be formed on the capping layer 220. In some exemplary embodiments, a plurality of the bit lines 240 may be formed on the capping layer 220 in the first direction, and each bit line 240 may extend in the second direction. In some exemplary embodiments, the bit line 240 may include, for example, a metal, a metal nitride, a metal silicide and/or doped polysilicon.

A bit line contact (not shown) electrically connected to the bit line 240 and a common source line (CSL) may also be formed.

The detailed description of the second gate structures 196 contained herein has described the second gate structures in the context of floating gate type flash memory devices. However, the inventive concept may be also applied to other memory devices, such as, for example, charge trapping type flash memory devices.

FIGS. 13 to 21 are schematic cross-sectional views illustrating a method of manufacturing a semiconductor device in accordance with exemplary embodiments of the inventive concept. In the method of manufacturing the semiconductor device illustrated in FIGS. 13 to 21, processes for forming the elements on the peripheral region PA may be substantially the same as those illustrated and described in detail above with reference to FIGS. 3 to 11. Like reference numerals refer to like elements, and detailed description of like elements will not be repeated.

Figure 13:
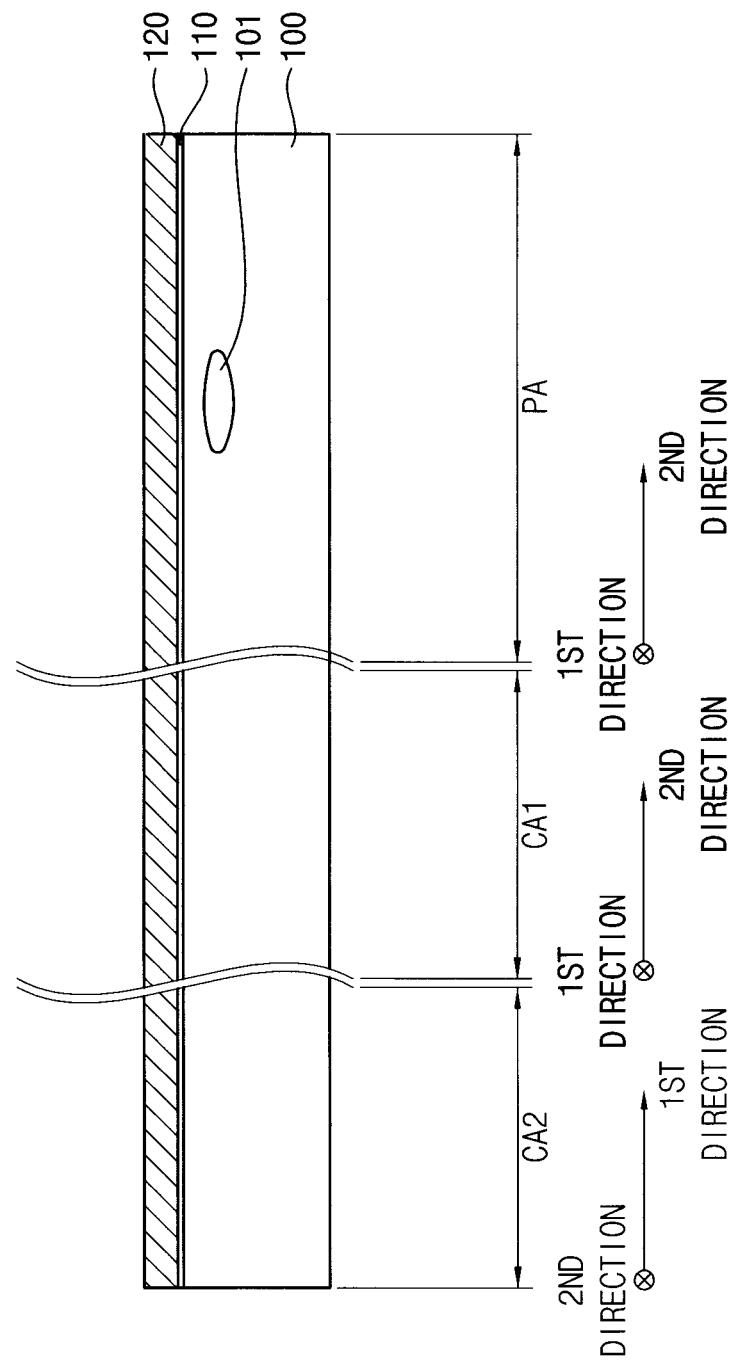
FIGS. 13 to 21 are schematic cross-sectional views illustrating a method of manufacturing a semiconductor device in accordance with exemplary embodiments of the inventive concept.

Referring to FIG. 13, in some exemplary embodiments, first impurities may be implanted into a peripheral region PA of a substrate 100 to form a first impurity region 101. In some exemplary embodiments, P-type or n-type impurities may be implanted into the substrate 100 to form a well region before forming the first impurity region 101. A tunnel insulation layer 110 and a floating gate layer 120 may be sequentially formed on the substrate 100.

Figure 14:
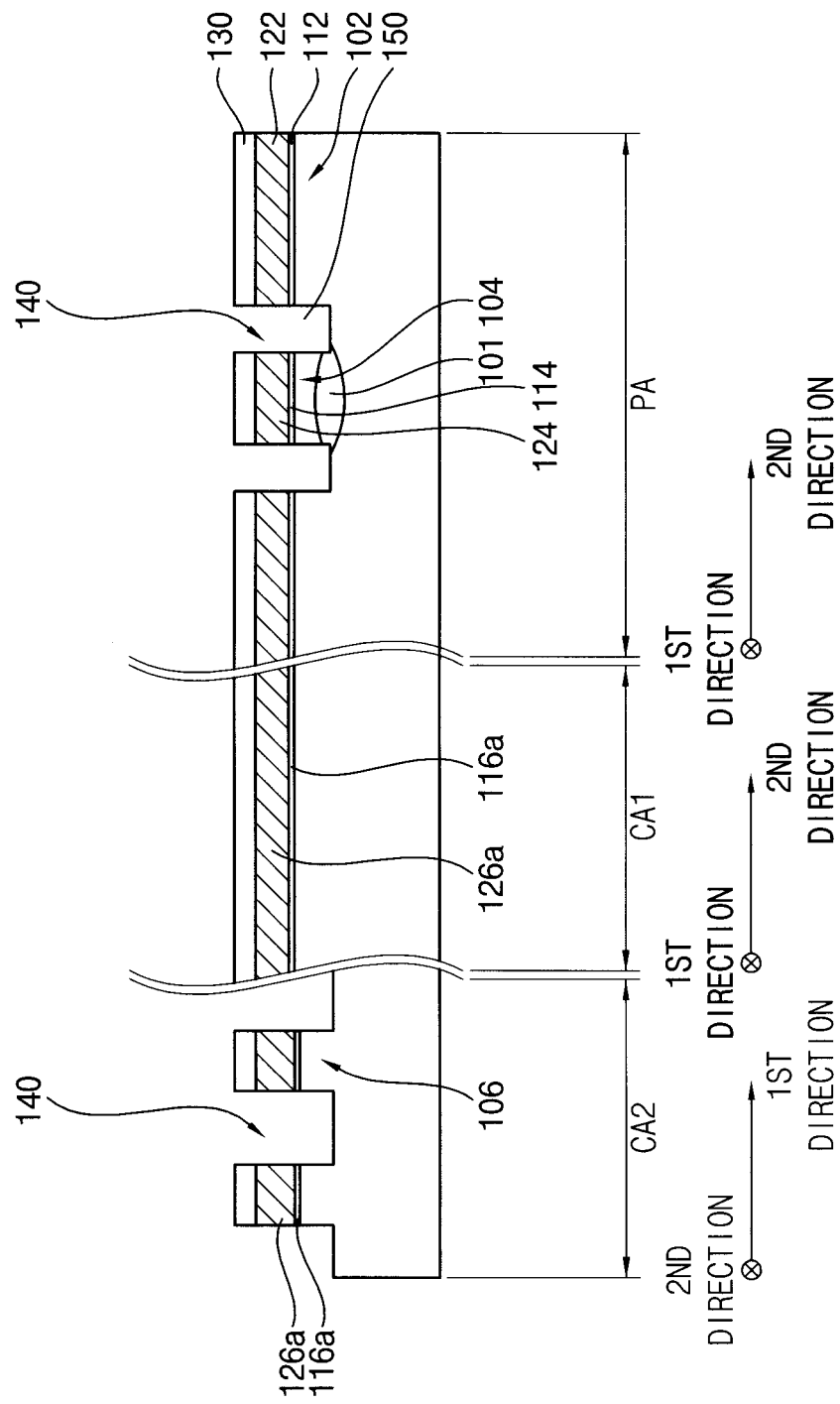

Referring to FIG. 14, in some exemplary embodiments, a hard mask 130 may be formed on the floating gate layer 120. The floating gate layer 120, the tunnel insulation layer 110 and an upper portion of the substrate 100 may be etched using the hard mask 130 as an etching mask to form a trench 140. As a result of forming the trench 140, first, second and third active regions 102, 104 and 106 divided by the trench 140 may be formed in the substrate 100. In some exemplary embodiments, a plurality of third active regions 106 may be formed in a first direction, and each third active region 106 may extend in a second direction perpendicular to the first direction.

In some exemplary embodiments, the floating gate layer 120 and the tunnel insulation layer 110 may be partially etched. This partial etching forms a first tunnel insulation layer pattern 112 and a first floating gate 122 sequentially stacked on each first active region 102, a second tunnel insulation layer pattern 114 and a second floating gate 124 sequentially stacked on the second active region 104, and a preliminary third tunnel insulation layer pattern 116a and a preliminary third floating gate 126a sequentially stacked on the third active region 106. The preliminary third tunnel insulation layer pattern 116a and the preliminary third floating gate 126a may extend on the third active region 106 in the second direction.

Figure 15:
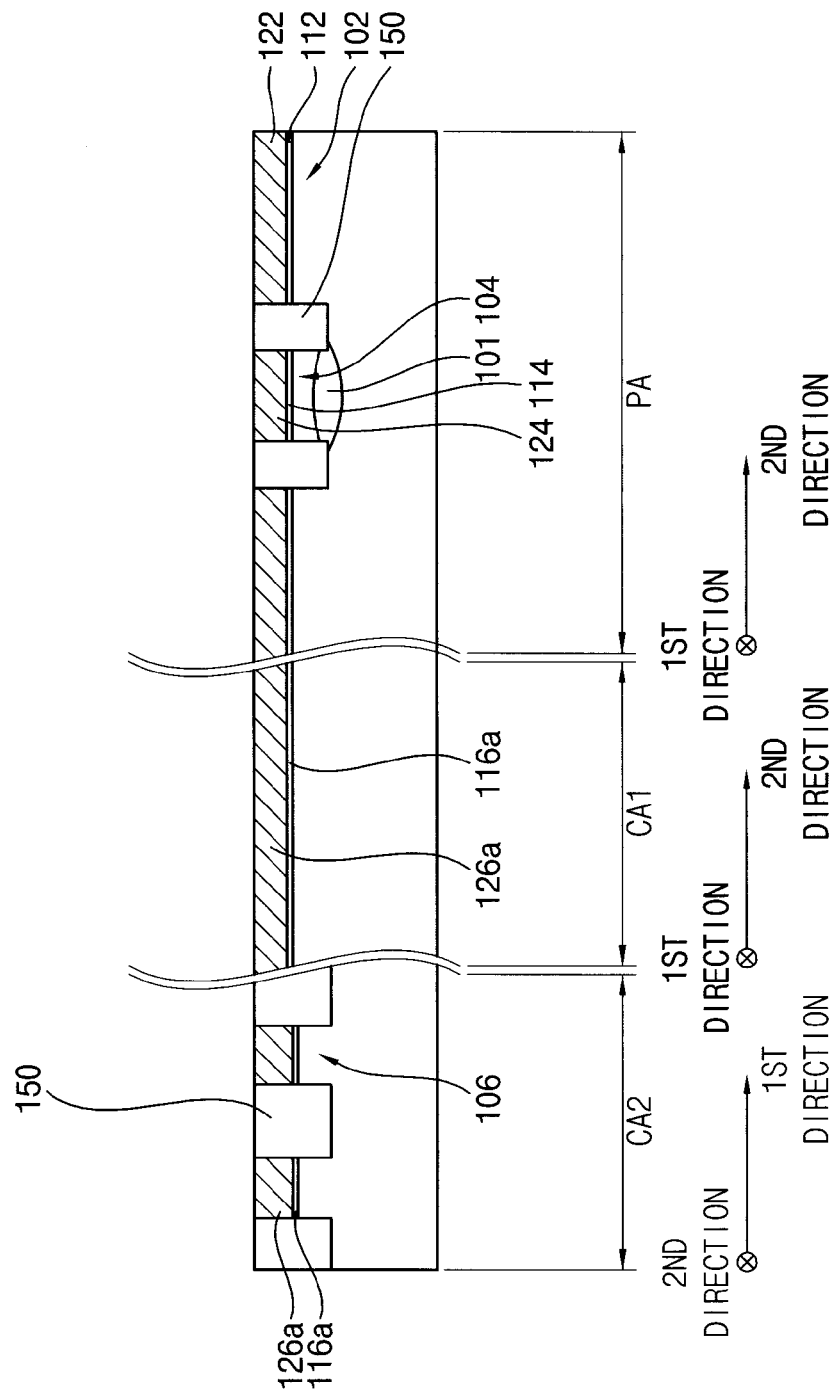

Referring to FIG. 15, in some exemplary embodiments, an isolation layer 150 filling the trench 140 may be formed.

Figure 16:
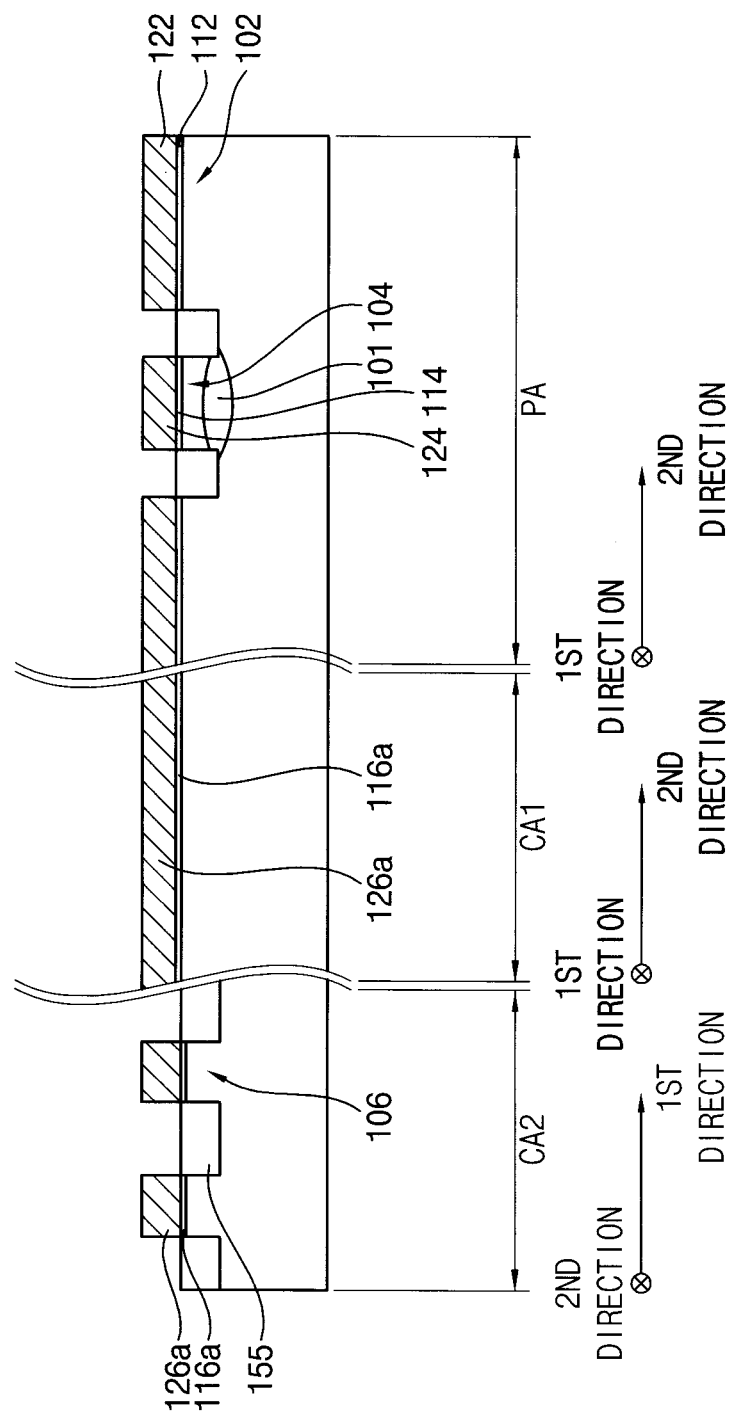

Referring to FIG. 16, in some exemplary embodiments, upper portions of the isolation layer 150 may be removed to form an isolation layer pattern 155, which exposes sidewalls of the first and second floating gates 122 and 124 and the preliminary third floating gate 126a. In some exemplary embodiments, the isolation layer pattern 155 may be formed to have a height substantially the same as the height of top surfaces of the first and second tunnel insulation layer patterns 112 and 114 and the preliminary third tunnel insulation layer pattern 116a. In some alternative exemplary embodiments, the isolation layer pattern 155 may be formed to have a height higher than the height of top surfaces of the first and second tunnel insulation layer patterns 112 and 114 and the preliminary third tunnel insulation layer pattern 116a.

Figure 17:
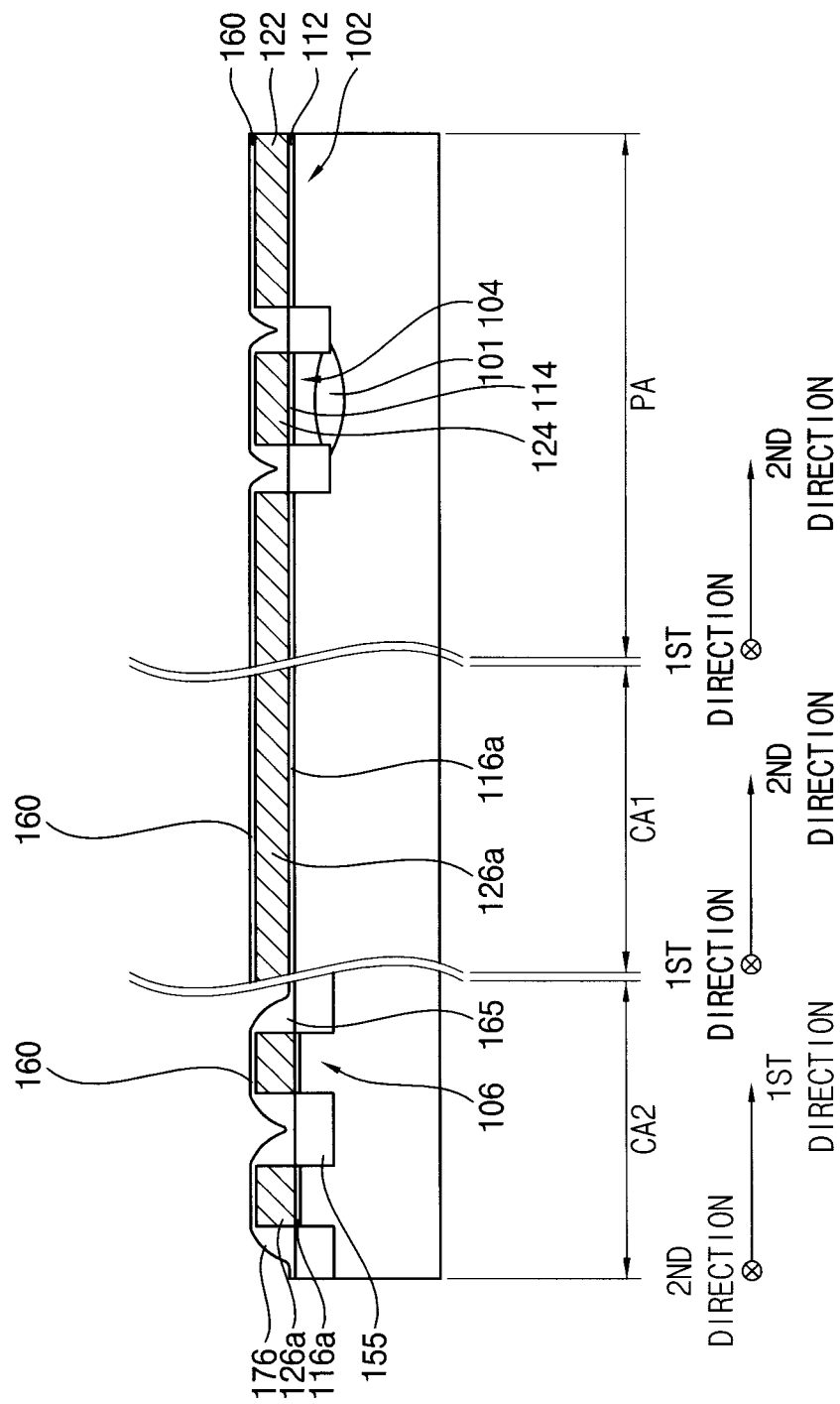

Referring to FIG. 17, in some exemplary embodiments, a first spacer layer 160 covering the first and second floating gates 122 and 124 and the preliminary third floating gate 126a may be formed on the substrate 100 and the isolation layer pattern 155.

Figure 18:
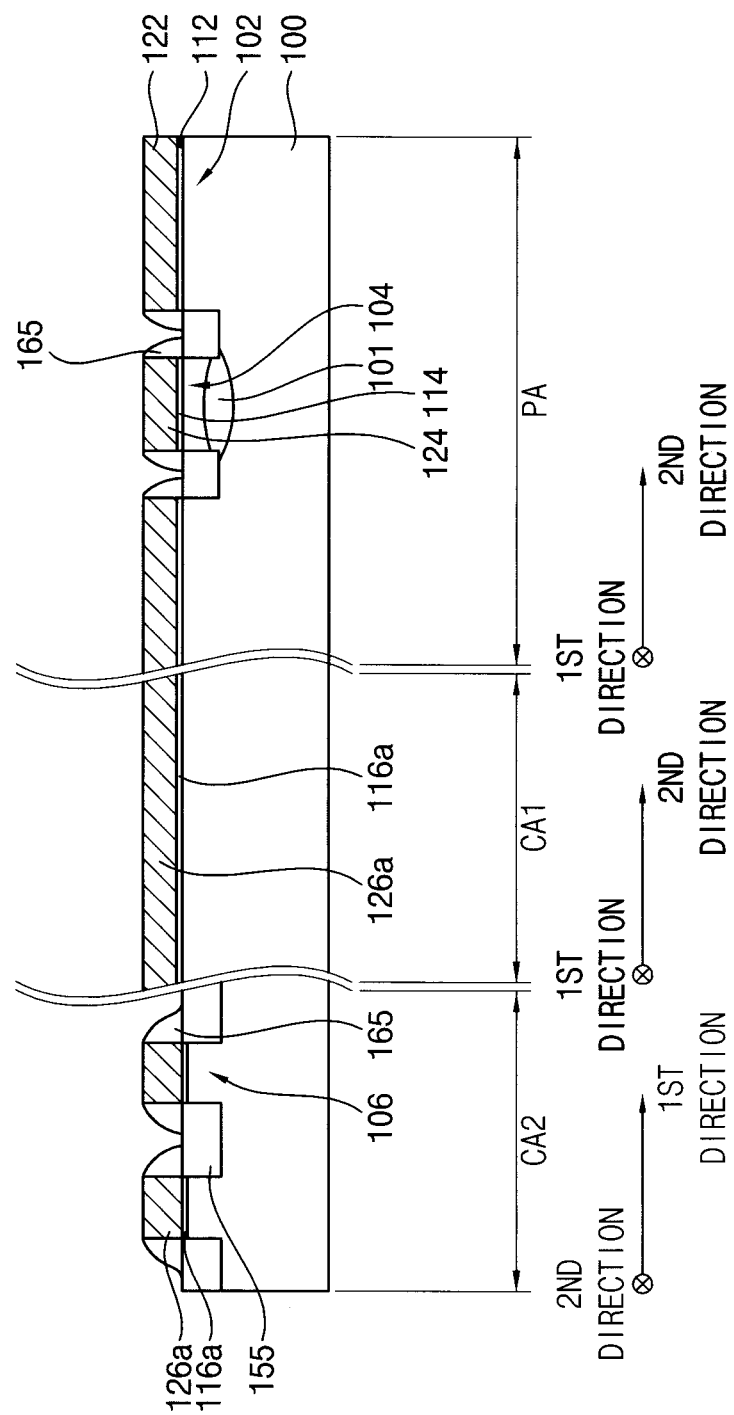

Referring to FIG. 18, in some exemplary embodiments, the first spacer layer 160 may be etched by an anisotropic etching process to form first spacers 165 on sidewalls of the first and second floating gates 122 and 124 and the preliminary third floating gate 126a.

Figure 19:
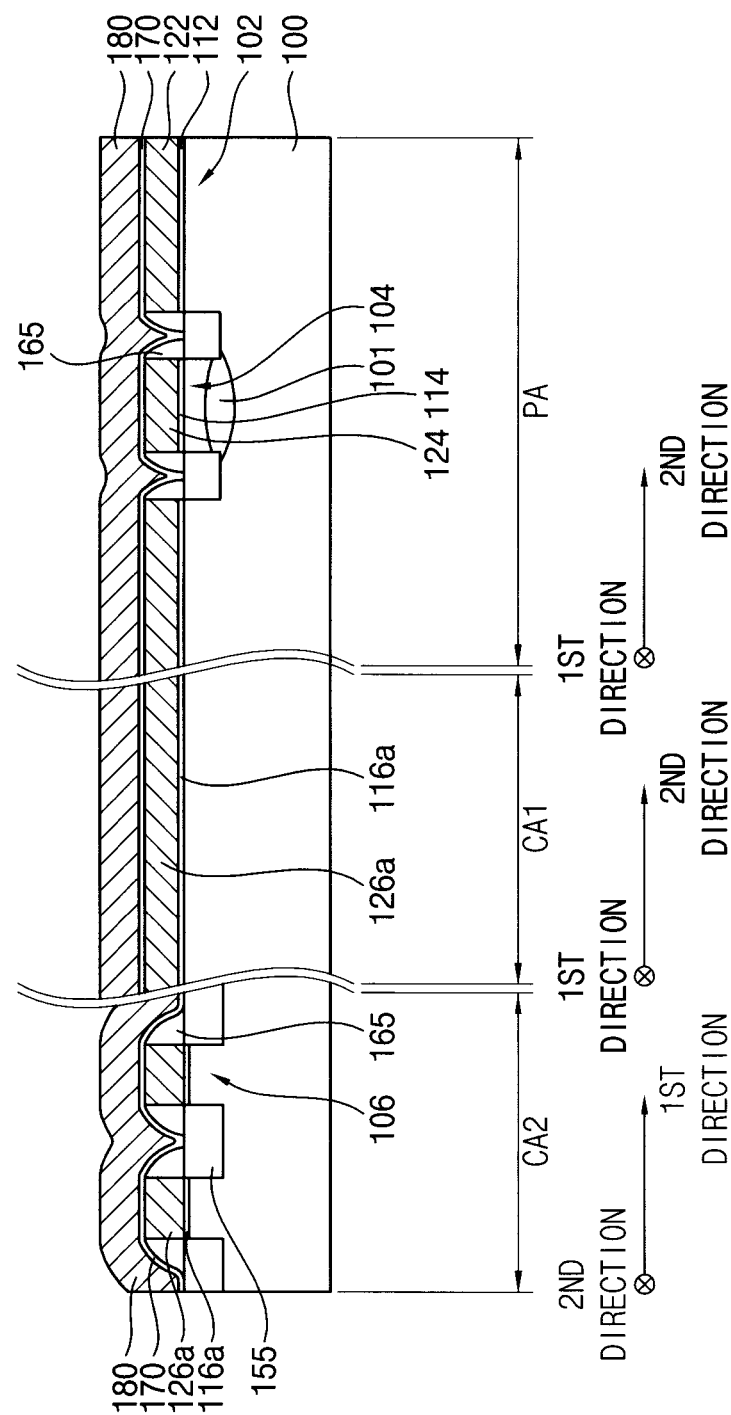

Referring to FIG. 19, in some exemplary embodiments, a dielectric layer 170 and a control gate layer 180 may be sequentially formed on the first and second floating gates 122 and 124, the preliminary third floating gate 126a, the first spacers 165 and the isolation layer pattern 155.

Figure 20:
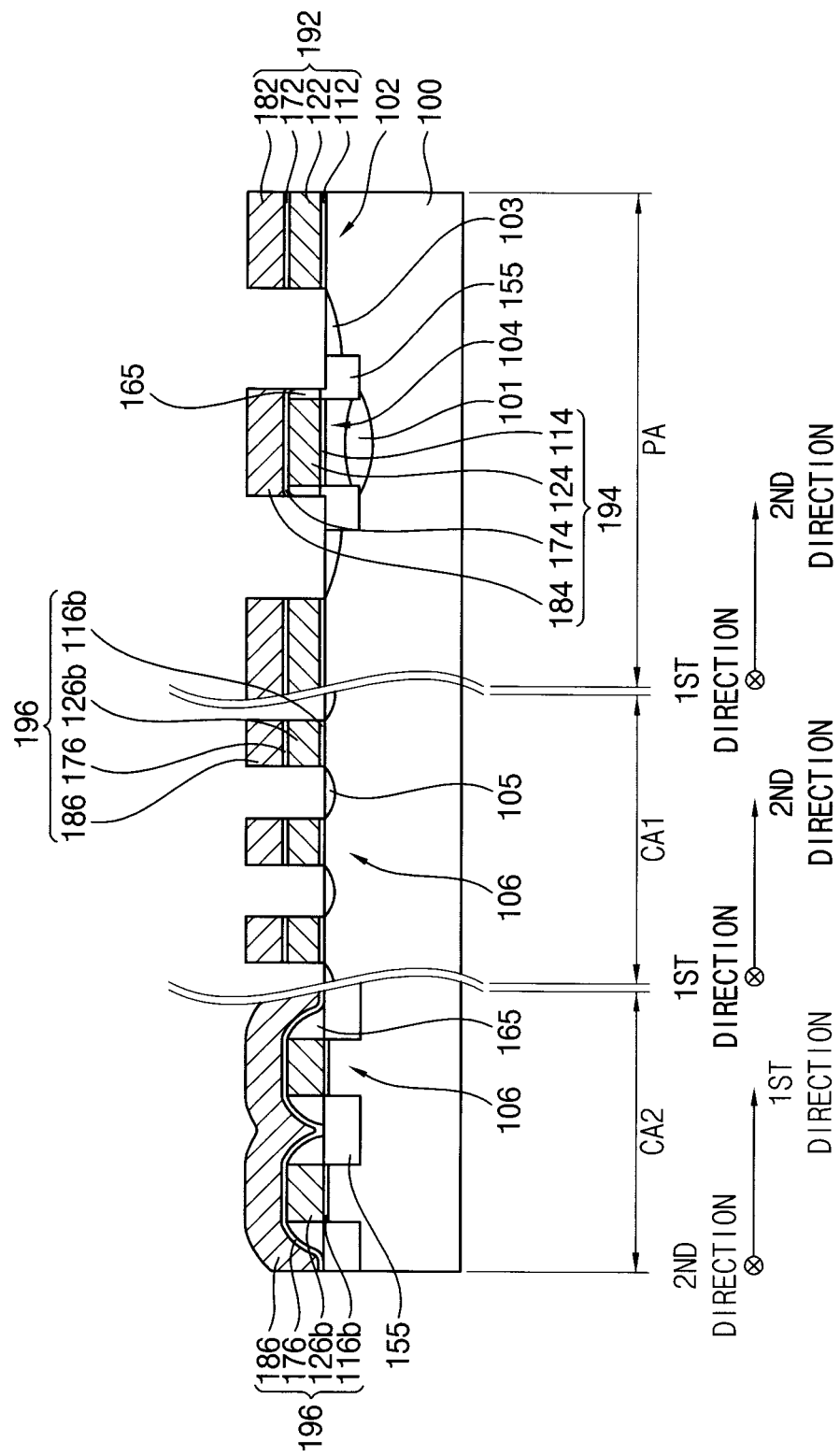

Referring to FIG. 20, in some exemplary embodiments, the control gate layer 180, the dielectric layer 170, the first floating gate 122, the first tunnel insulation layer pattern 112, the preliminary third floating gate 126a, the preliminary third tunnel insulation layer pattern 116a and the first spacers 165 may be partially removed. As a result, first gate structures 192 may be formed on the first active regions 102, a dummy gate structure 194 may be formed on the second active region 104, and second gate structures 196 may be formed on the third active region 106.

In some exemplary embodiments, each of the second gate structures 196 may have a third tunnel insulation layer pattern 116b, a third floating gate 126b, a third dielectric layer pattern 176 and a third control gate 186 sequentially stacked on third active region 106. In some exemplary embodiments, the third tunnel insulation layer pattern 116b and the third floating gate 126b may have an island shape on the third active region 106, and the third dielectric layer pattern 176 and the third control gate 186 may extend on the third active region 106 and the isolation layer pattern 155 in the first direction. In some alternative exemplary embodiments, the third tunnel insulation layer pattern 116 may extend on the third active region 106 in the second direction.

In some exemplary embodiments, second and third impurity regions 103 and 105 may be formed at upper portions of the first active regions 102 that are not covered by the first gate structures 192 and at upper portions of the third active regions 106 that are not covered by the second gate structures 196, respectively. In some exemplary embodiments, an ion implantation process may be performed on the substrate 100 using the first and second gate structures 192 and 196 as an ion implantation mask to form the second and third impurity regions 103 and 105, respectively, doped with n-type impurities.

Figure 21:
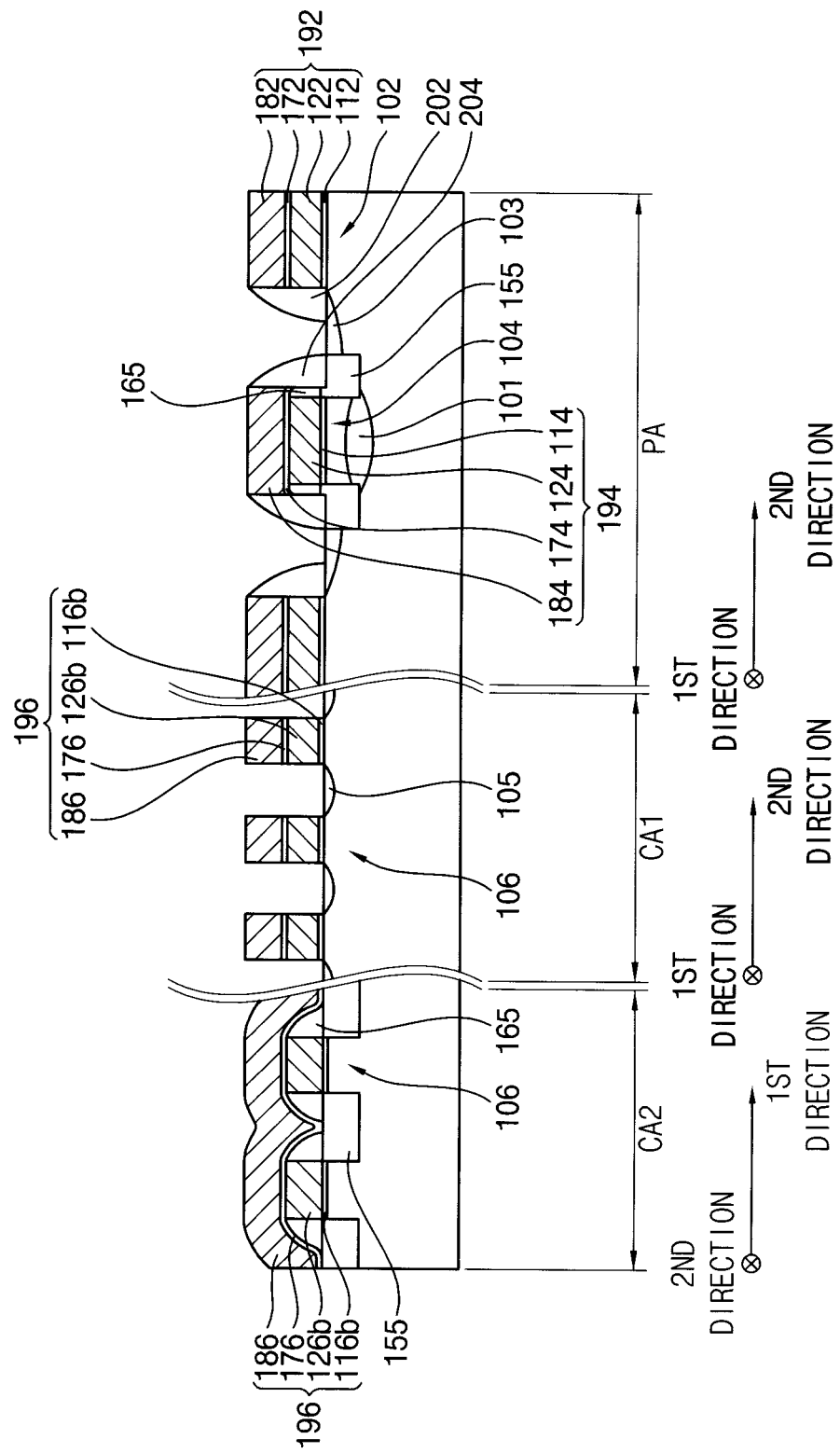

Referring to FIG. 21, in some exemplary embodiments, second spacers 202 may be formed on sidewalls of the first gate structures 192, and third spacers 204 may be formed on sidewalls of the dummy gate structure 194 and a remaining portion of the first spacers 165.

Referring to FIG. 12 again, in some exemplary embodiments, an insulating interlayer covering the first and second gate structures 192 and 196, the dummy gate structure 194 and the second and third spacers 202 and 204 may be formed on the substrate 100 to sufficiently fill spaces therebetween. The insulating interlayer may be planarized until the first and second gate structures 192 and 196 and the dummy gate structure 194 are exposed to form a first insulating interlayer pattern 210 on the peripheral region PA and a second insulating interlayer pattern 215 on the cell region CA.

In some exemplary embodiments, a capping layer 220 may be further formed on the first and second gate structures 192 and 196, the dummy gate structure 194 and the first and second insulating interlayer patterns 210 and 215. In some alternative exemplary embodiments, the capping layer 220 may not be formed. Instead, the planarization process may be performed so that a portion of the first and second insulation layer patterns 210 and 220 may remain on the first and second gate structures 192 and 196 and the dummy gate structure 194.

In some exemplary embodiments, the capping layer 220 may be partially removed to form an opening (not shown) exposing the first gate structures 192 and the dummy gate structure 194. A first conductive layer filling the opening may be formed on first gate structures 192, the dummy gate structure 194 and the capping layer 220. An upper portion of the first conductive layer on the capping layer 220 may be removed to form first plugs 232 contacting the first gate structures 192 and second plugs 234 contacting the dummy gate structure 194.

In some exemplary embodiments, a second conductive layer may be formed on the first and second plugs 232 and 234 and the capping layer 220. The second conductive layer may be patterned to form first and second wirings 252 and 254, respectively.

The semiconductor device of the various exemplary embodiments of the inventive concept described herein in detail may be manufactured by the above-described processes.

According to exemplary embodiments described herein in detail, in a semiconductor device a dummy gate structure may be formed between gate structures in a high voltage region of the semiconductor device to increase the total density of gate structures. The dummy gate structure may be formed on an active region to have a height substantially the same as the height of the gate structures, thereby serving as an etch stop layer for a subsequently formed insulating interlayer. Additionally, a voltage may be applied to the dummy gate structure to prevent the breakdown voltage of an impurity region adjacent to the gate structures from decreasing.

The foregoing detailed description is descriptive of exemplary embodiments and is not to be construed as limiting thereof. Although some exemplary embodiments have been described, those skilled in the art will readily appreciate that many modifications are possible to the exemplary embodiments without materially departing from the novel teachings and advantages of the present inventive concept. Accordingly, all such modifications are intended to be included within the scope of the present inventive concept as defined in the claims.

What is claimed is:

1. A semiconductor device, comprising:
    a substrate comprising a plurality of first active regions and a second active region disposed between two of the first active regions, the substrate being lightly doped with p-type impurities;
    an isolation layer on the substrate, the isolation layer defining the first and second active regions;
    a plurality of gate structures disposed respectively on the plurality of first active regions;
    a dummy gate structure disposed on the second active region, a first voltage being applied to the dummy gate structure, and
    an impurity region disposed in a portion of the second active region, a top surface of the impurity region being lower than a top surface of the substrate and a bottom surface of the impurity region being lower than a bottom surface of the isolation layer, and the impurity region contacting a lower portion of the isolation layer, being heavily doped with p-type impurities and having a first side contacting the isolation layer and a second side opposite the first side contacting the isolation layer such that the impurity region extends beneath the dummy gate structure.

2. The device of claim 1, wherein the impurity region preventing a channel from being generated in the second active region.

3. The device of claim 1, wherein the impurity region is formed adjacent to a lower portion of the isolation layer.

4. The device of claim 1, wherein each of the gate structures includes a first tunnel insulation layer pattern, a first floating gate, a first dielectric layer pattern and a first control gate,
and wherein the dummy gate structure includes a second tunnel insulation layer pattern, a second floating gate, a second dielectric layer pattern and a second control gate.

5. The device of claim 4, wherein the second control gate has a width larger than widths of the second floating gate and the second tunnel insulation layer pattern.

6. The device of claim 5, wherein the second floating gate and the second tunnel insulation layer pattern have a width substantially the same as a width of the second active region.

7. The device of claim 1, wherein the dummy gate structure includes a material substantially the same as a material of the gate structures, and the dummy gate structure has a height substantially the same as a height of the gate structures.

8. The device of claim 1, further comprising a conductive element for applying a first voltage to the dummy gate structure, wherein a second voltage higher than the first voltage is applied to the gate structures.

9. The device of claim 1, wherein each of the gate structures includes a first tunnel insulation layer pattern, a first charge trapping layer pattern, a first blocking layer pattern and a first gate electrode,
and wherein the dummy gate structure includes a second tunnel insulation layer pattern, a second charge trapping layer pattern, a second blocking layer pattern and a second gate electrode.

10. The device of claim 9, wherein the second gate electrode has a width larger than widths of the second charge trapping layer pattern and the second tunnel insulation layer pattern.

11. A semiconductor device, comprising:
a substrate having a peripheral region and a cell region, the peripheral region including a plurality of first active regions and a second active region disposed between two of the first active regions, the cell region including a third active region, and the substrate being lightly doped with p-type impurities;
an isolation layer on the substrate, the isolation layer defining the first, second and third active regions;
a plurality of first gate structures disposed respectively on the plurality of first active regions of the substrate;
a dummy gate structure disposed on the second active region, a first voltage being applied to the dummy gate structure;
a plurality of second gate structures disposed on the third active region, and
an impurity region disposed in a portion of the second active region, a top surface of the impurity region being lower than a top surface of the substrate and a bottom surface of the impurity region being lower than a bottom surface of the isolation layer, and the impurity region contacting a lower portion of the isolation layer, being heavily doped with p-type impurities and having a first side contacting the isolation layer and a second side opposite the first side contacting the isolation layer such that the impurity region extends beneath the dummy gate structure.

12. The device of claim 11, wherein the impurity region preventing a channel from being generated in the second active region.

13. The device of claim 11, wherein each of the first gate structures includes a first tunnel insulation layer pattern, a first floating gate, a first dielectric layer pattern and a first control gate,
wherein the dummy gate structure includes a second tunnel insulation layer pattern, a second floating gate, a second dielectric layer pattern and a second control gate,
and wherein each of the second gate structures includes a third tunnel insulation layer pattern, a third floating gate, a third dielectric layer pattern and a third control gate.

14. The device of claim 13, wherein the second control gate has a width larger than widths of the second floating gate and the second tunnel insulation layer pattern.

15. The device of claim 11, wherein the dummy gate structure includes a material substantially the same as a material of the first and second gate structures and a height substantially the same as a height of the first and second gate structures.

16. The device of claim 11, further comprising a conductive element for applying a first voltage to the dummy gate structure, wherein a second voltage higher than the first voltage is applied to the first gate structures.

* * * * *